United States Patent
Krietzman et al.

(10) Patent No.: US 8,710,369 B2
(45) Date of Patent: Apr. 29, 2014

(54) HORIZONTAL CABLE MANAGER

(75) Inventors: William Krietzman, Denver, CO (US);
Joshua James Young, Austin, TX (US);
D. Brian Donowho, Austin, TX (US)

(73) Assignee: Chatsworth Products, Inc., Westlake Village, CA (US)

( * ) Notice: Subject to any disclaimer, the term of this patent is extended or adjusted under 35 U.S.C. 154(b) by 676 days.

(21) Appl. No.: 13/007,724

(22) Filed: Jan. 17, 2011

(65) Prior Publication Data
US 2011/0174534 A1    Jul. 21, 2011

Related U.S. Application Data

(60) Provisional application No. 61/295,737, filed on Jan. 17, 2010.

(51) Int. Cl.
*H01B 7/00* (2006.01)
*H02G 3/04* (2006.01)

(52) U.S. Cl.
USPC .......................... 174/68.3; 174/135

(58) Field of Classification Search
CPC .................................... H02G 3/0418
USPC .......................... 174/50, 68.3, 135
See application file for complete search history.

(56) References Cited

U.S. PATENT DOCUMENTS

| | | |
|---|---|---|
| 2,531,110 A | 11/1950 | Cisler |
| 2,817,870 A | 12/1957 | Howell |
| 2,921,607 A | 1/1960 | Caveney |
| 3,008,177 A | 11/1961 | Wooten |
| 3,403,220 A | 9/1968 | Riedel et al. |
| 3,485,937 A | 12/1969 | Caveney |
| 3,705,949 A | 12/1972 | Weiss |
| 3,761,603 A | 9/1973 | Hays et al. |
| 3,890,459 A | 6/1975 | Caveney |
| 3,906,146 A | 9/1975 | Taylor |

(Continued)

FOREIGN PATENT DOCUMENTS

| | | |
|---|---|---|
| AU | 322229 | 11/2008 |
| AU | 322230 | 11/2008 |

(Continued)

OTHER PUBLICATIONS

Information Disclosure Statement (IDS) Letter Regarding Common Patent Application(s), dated Jul. 22, 2011.

(Continued)

*Primary Examiner* — Hung Ngo
(74) *Attorney, Agent, or Firm* — Tillman Wright, PLLC; James D. Wright; David R. Higgins

(57) ABSTRACT

A cable manager includes a trough, defining a footprint, and a door. At least one side of the trough is formed from a plurality of finger-like projections extending forwardly from a support member. At least two of the projections include a hinge boss disposed at an outer end thereof and extending inwardly. At least one edge of the door has a hinge structure disposed therealong that includes an outer arm and an inner arm defining a hinge channel therebetween. The hinge bosses are disposed within the hinge channel such that the door is rotatably attached along at least one of its longitudinal edges to the trough. The door is rotatable to an open state without extending beyond the footprint of the trough.

21 Claims, 9 Drawing Sheets

(56) References Cited

U.S. PATENT DOCUMENTS

| | | |
|---|---|---|
| 3,968,322 A | 7/1976 | Taylor |
| 4,046,957 A | 9/1977 | Taylor et al. |
| 4,136,257 A | 1/1979 | Taylor |
| 4,398,564 A | 8/1983 | Young et al. |
| 4,484,020 A | 11/1984 | Loof et al. |
| 4,497,411 A | 2/1985 | DeBortoli |
| D282,538 S | 2/1986 | Loof et al. |
| 4,613,174 A | 9/1986 | Berg et al. |
| 4,902,852 A | 2/1990 | Wuertz |
| 4,964,020 A | 10/1990 | Savage et al. |
| 4,974,289 A | 12/1990 | Piard |
| 5,024,251 A | 6/1991 | Chapman |
| 5,086,195 A | 2/1992 | Claisse |
| D326,200 S | 5/1992 | Allen et al. |
| 5,187,836 A | 2/1993 | Kim et al. |
| 5,235,136 A | 8/1993 | Santucci et al. |
| 5,323,916 A | 6/1994 | Salmon |
| 5,577,151 A | 11/1996 | Hoffer |
| 5,602,364 A | 2/1997 | Ustin |
| 5,640,482 A | 6/1997 | Barry et al. |
| 5,675,934 A | 10/1997 | Park |
| 5,685,113 A | 11/1997 | Reuter et al. |
| 5,739,469 A | 4/1998 | Lopez et al. |
| 5,758,002 A | 5/1998 | Walters |
| 5,765,698 A | 6/1998 | Bullivant |
| 5,829,197 A | 11/1998 | Oh |
| 5,902,961 A | 5/1999 | Viklund et al. |
| 5,933,563 A | 8/1999 | Schaffer et al. |
| 5,940,937 A | 8/1999 | Churchill et al. |
| 5,942,729 A | 8/1999 | Carlson et al. |
| 5,971,509 A | 10/1999 | Deimen et al. |
| 6,047,838 A | 4/2000 | Rindoks et al. |
| 6,082,837 A | 7/2000 | Battochio et al. |
| 6,102,214 A | 8/2000 | Mendoza |
| 6,107,575 A | 8/2000 | Miranda |
| 6,107,576 A | 8/2000 | Morton et al. |
| 6,127,631 A | 10/2000 | Green et al. |
| 6,135,583 A | 10/2000 | Simon et al. |
| 6,142,594 A | 11/2000 | Benner et al. |
| 6,201,919 B1 | 3/2001 | Puetz et al. |
| D440,210 S | 4/2001 | Larsen et al. |
| 6,215,069 B1 | 4/2001 | Martin et al. |
| 6,261,026 B1 | 7/2001 | Conley et al. |
| 6,263,141 B1 * | 7/2001 | Smith ........................... 385/135 |
| 6,293,056 B1 | 9/2001 | He |
| 6,307,997 B1 | 10/2001 | Walters et al. |
| 6,318,680 B1 | 11/2001 | Benedict et al. |
| 6,321,917 B1 | 11/2001 | Mendoza |
| 6,347,714 B1 | 2/2002 | Fournier et al. |
| 6,365,834 B1 | 4/2002 | Larsen et al. |
| 6,401,940 B1 | 6/2002 | Hartel et al. |
| 6,403,885 B1 | 6/2002 | Baker et al. |
| 6,423,898 B1 | 7/2002 | Croker |
| 6,437,243 B1 | 8/2002 | VanderVelde et al. |
| 6,437,244 B1 | 8/2002 | VanderVelde |
| D463,253 S | 9/2002 | Canty |
| 6,467,633 B1 | 10/2002 | Mendoza |
| 6,468,112 B1 | 10/2002 | Follingstad et al. |
| 6,489,565 B1 | 12/2002 | Krietzman et al. |
| 6,501,899 B1 | 12/2002 | Marrs et al. |
| D468,700 S | 1/2003 | Dagley et al. |
| D473,850 S | 4/2003 | Rouleau et al. |
| 6,584,267 B1 | 6/2003 | Caveney et al. |
| 6,590,785 B1 | 7/2003 | Lima et al. |
| 6,600,107 B1 | 7/2003 | Wright et al. |
| 6,605,782 B1 | 8/2003 | Krietzman et al. |
| 6,614,665 B2 | 9/2003 | Witty et al. |
| 6,614,978 B1 | 9/2003 | Caveney |
| 6,647,197 B1 | 11/2003 | Marrs et al. |
| 6,702,125 B2 | 3/2004 | Hartel |
| 6,708,830 B2 | 3/2004 | Mendoza |
| 6,760,531 B1 | 7/2004 | Solheid et al. |
| 6,766,093 B2 | 7/2004 | McGrath et al. |
| 6,785,459 B2 | 8/2004 | Schmidt et al. |
| 6,796,437 B2 | 9/2004 | Krampotich et al. |
| 6,796,438 B2 | 9/2004 | Mendoza |
| 6,814,244 B1 | 11/2004 | Hathcock |
| 6,855,884 B2 | 2/2005 | Spagnoli et al. |
| 6,884,942 B2 | 4/2005 | McGrath et al. |
| 6,918,796 B2 | 7/2005 | Elliot et al. |
| D509,479 S | 9/2005 | DePaola |
| 6,946,605 B2 | 9/2005 | Levesque et al. |
| 6,964,588 B2 | 11/2005 | Follingstad et al. |
| 6,968,647 B2 | 11/2005 | Levesque et al. |
| 6,981,893 B2 | 1/2006 | Barker et al. |
| 7,000,784 B2 | 2/2006 | Canty et al. |
| 7,019,213 B1 | 3/2006 | McNutt et al. |
| 7,026,553 B2 | 4/2006 | Levesque et al. |
| 7,041,898 B2 | 5/2006 | Stempinski et al. |
| 7,041,912 B2 | 5/2006 | Kadrnoska et al. |
| 7,060,893 B1 | 6/2006 | Villi |
| 7,077,688 B2 | 7/2006 | Peng |
| 7,083,051 B2 | 8/2006 | Smith et al. |
| 7,119,282 B2 | 10/2006 | Krietzman et al. |
| 7,142,765 B2 | 11/2006 | Rapp et al. |
| 7,152,936 B2 | 12/2006 | Tarasewicz |
| 7,178,292 B2 | 2/2007 | Yamada |
| 7,178,679 B2 | 2/2007 | Canty et al. |
| D539,228 S | 3/2007 | Toikka et al. |
| D539,755 S | 4/2007 | Makwinski et al. |
| 7,220,150 B2 | 5/2007 | Follingstad et al. |
| 7,225,586 B2 | 6/2007 | Levesque et al. |
| 7,285,027 B2 | 10/2007 | McGrath et al. |
| 7,362,941 B2 | 4/2008 | Rinderer et al. |
| 7,378,046 B2 | 5/2008 | Canty et al. |
| 7,381,100 B2 | 6/2008 | Follingstad et al. |
| 7,408,121 B2 | 8/2008 | Halliday et al. |
| 7,417,188 B2 | 8/2008 | McNutt et al. |
| 7,425,678 B2 | 9/2008 | Adducci et al. |
| 7,427,713 B2 | 9/2008 | Adducci et al. |
| 7,437,048 B2 | 10/2008 | Farrell et al. |
| 7,458,859 B2 | 12/2008 | McGrath et al. |
| 7,476,804 B2 | 1/2009 | Adducci et al. |
| 7,485,803 B2 | 2/2009 | Adducci et al. |
| 7,495,169 B2 | 2/2009 | Adducci et al. |
| 7,498,512 B2 | 3/2009 | Adducci et al. |
| 7,504,581 B2 | 3/2009 | Adducci et al. |
| D592,938 S | 5/2009 | Pae et al. |
| D596,928 S | 7/2009 | Lawrence et al. |
| 7,565,051 B2 | 7/2009 | Vongseng |
| D602,764 S | 10/2009 | Pae et al. |
| 7,637,771 B2 | 12/2009 | Laursen |
| D611,326 S | 3/2010 | Alaniz et al. |
| 7,718,891 B2 | 5/2010 | Adducci et al. |
| 7,762,405 B2 | 7/2010 | Vogel et al. |
| 7,772,489 B2 | 8/2010 | Adducci et al. |
| 7,778,513 B2 | 8/2010 | Rinderer et al. |
| 7,795,532 B2 | 9/2010 | Walker |
| 7,804,685 B2 | 9/2010 | Krietzman |
| 7,813,146 B1 | 10/2010 | Phan |
| D629,289 S | 12/2010 | Krietzman et al. |
| D630,167 S | 1/2011 | Donowho |
| 7,874,433 B2 | 1/2011 | Levesque et al. |
| 7,880,084 B2 | 2/2011 | Adducci et al. |
| 7,893,356 B2 | 2/2011 | Garza et al. |
| D635,935 S | 4/2011 | Donowho |
| D637,065 S | 5/2011 | Krietzman et al. |
| D637,066 S | 5/2011 | Krietzman et al. |
| 7,939,763 B2 | 5/2011 | Jones et al. |
| D640,528 S | 6/2011 | Krietzman et al. |
| 7,973,242 B2 | 7/2011 | Jones et al. |
| 7,974,105 B2 | 7/2011 | Dean, Jr. et al. |
| 7,999,183 B2 | 8/2011 | Garza et al. |
| 8,003,890 B2 | 8/2011 | Donowho et al. |
| 8,035,965 B2 | 10/2011 | Adducci et al. |
| D651,570 S | 1/2012 | Donowho et al. |
| D653,623 S | 2/2012 | Young et al. |
| 8,138,419 B2 | 3/2012 | Garza et al. |
| 8,263,867 B2 | 9/2012 | Garza et al. |
| 8,273,989 B2 | 9/2012 | Garza et al. |
| 8,330,043 B2 | 12/2012 | Alaniz et al. |
| 8,395,046 B2 | 3/2013 | Nicewicz et al. |
| 8,411,465 B2 | 4/2013 | Dean, Jr. et al. |
| 8,437,147 B2 | 5/2013 | Dean, Jr. et al. |

(56) References Cited

U.S. PATENT DOCUMENTS

| | | | |
|---|---|---|---|
| 8,558,113 | B2 | 10/2013 | Krietzman et al. |
| 2001/0022231 | A1 | 9/2001 | Dyer |
| 2002/0197045 | A1 | 12/2002 | Schmidt et al. |
| 2003/0020379 | A1 | 1/2003 | Larsen et al. |
| 2003/0037953 | A1 | 2/2003 | Sarkinen et al. |
| 2003/0072551 | A1 | 4/2003 | Douglas et al. |
| 2003/0118311 | A1 | 6/2003 | Thibault et al. |
| 2003/0190036 | A1 | 10/2003 | Mandoza |
| 2004/0007372 | A1 | 1/2004 | Krietzman et al. |
| 2004/0050808 | A1 | 3/2004 | Krampotich et al. |
| 2004/0094491 | A1 | 5/2004 | Smith et al. |
| 2004/0146266 | A1 | 7/2004 | Solheid et al. |
| 2004/0173545 | A1 | 9/2004 | Canty et al. |
| 2004/0226900 | A1 | 11/2004 | Canty et al. |
| 2005/0078437 | A1 | 4/2005 | Chuang et al. |
| 2005/0103517 | A1 | 5/2005 | Canepa |
| 2005/0115152 | A1 | 6/2005 | Levesque et al. |
| 2005/0115736 | A1 | 6/2005 | Levesque et al. |
| 2005/0115737 | A1 | 6/2005 | Levesque et al. |
| 2005/0221683 | A1 | 10/2005 | McGrath et al. |
| 2005/0247650 | A1 | 11/2005 | Vogel et al. |
| 2006/0054336 | A1 | 3/2006 | McNutt et al. |
| 2006/0059802 | A1 | 3/2006 | McNutt et al. |
| 2006/0091086 | A1 | 5/2006 | Canty et al. |
| 2006/0162948 | A1 | 7/2006 | Rinderer et al. |
| 2007/0001003 | A1* | 1/2007 | Lee et al. .................. 235/435 |
| 2007/0210679 | A1 | 9/2007 | Adducci et al. |
| 2007/0210680 | A1 | 9/2007 | Appino et al. |
| 2007/0210681 | A1 | 9/2007 | Adducci et al. |
| 2007/0210683 | A1 | 9/2007 | Adducci et al. |
| 2007/0210686 | A1 | 9/2007 | Adducci et al. |
| 2007/0212010 | A1 | 9/2007 | Caveney |
| 2007/0221393 | A1 | 9/2007 | Adducci et al. |
| 2007/0249237 | A1 | 10/2007 | Follingstad et al. |
| 2007/0293138 | A1 | 12/2007 | Adducci et al. |
| 2008/0074849 | A1 | 3/2008 | Adducci et al. |
| 2008/0130262 | A1 | 6/2008 | Rinderer et al. |
| 2008/0151524 | A1 | 6/2008 | Kelly et al. |
| 2008/0174217 | A1 | 7/2008 | Walker |
| 2009/0014614 | A1 | 1/2009 | Warmoth et al. |
| 2009/0090533 | A1 | 4/2009 | Jones et al. |
| 2009/0090538 | A1 | 4/2009 | Jones et al. |
| 2009/0093169 | A1 | 4/2009 | McGrath et al. |
| 2009/0190300 | A1 | 7/2009 | Takao et al. |
| 2009/0190307 | A1 | 7/2009 | Krietzman |
| 2009/0224110 | A1 | 9/2009 | Donowho et al. |
| 2009/0236117 | A1 | 9/2009 | Garza et al. |
| 2009/0273915 | A1 | 11/2009 | Dean, Jr. et al. |
| 2009/0283488 | A1 | 11/2009 | McMillan et al. |
| 2010/0061059 | A1 | 3/2010 | Krietzman et al. |
| 2010/0101820 | A1 | 4/2010 | Alaniz et al. |
| 2010/0122830 | A1 | 5/2010 | Garza et al. |
| 2010/0126750 | A1 | 5/2010 | Garza et al. |
| 2010/0126751 | A1 | 5/2010 | Garza et al. |
| 2010/0193754 | A1 | 8/2010 | Garza et al. |
| 2010/0200707 | A1 | 8/2010 | Garza et al. |
| 2011/0019362 | A1 | 1/2011 | Krietzman |
| 2011/0056895 | A1 | 3/2011 | Tichy |
| 2011/0180295 | A1 | 7/2011 | Krietzman et al. |
| 2011/0211328 | A1 | 9/2011 | Dean et al. |
| 2011/0211329 | A1 | 9/2011 | Dean et al. |
| 2011/0287704 | A1 | 11/2011 | Lewis, II et al. |
| 2011/0290553 | A1 | 12/2011 | Behrens et al. |
| 2012/0013229 | A1 | 1/2012 | Krietzman |

FOREIGN PATENT DOCUMENTS

| | | |
|---|---|---|
| AU | 322231 | 11/2008 |
| AU | 322233 | 11/2008 |
| AU | 323811 | 1/2009 |
| AU | 323812 | 1/2009 |
| AU | 332167 | 8/2010 |
| AU | 332168 | 8/2010 |
| CN | ZL200830139492.8 | 10/2009 |
| CN | ZL200830139487.7 | 11/2009 |
| CN | ZL200830139490.9 | 11/2009 |
| CN | ZL200830139491.3 | 11/2009 |
| CN | ZL200830139488.1 | 2/2010 |
| CN | 102177633 A | 9/2011 |
| EC | 000554316-0001 | 7/2006 |
| EC | 000968607-0001 | 7/2008 |
| EC | 000968607-0002 | 7/2008 |
| EC | 000968607-0003 | 7/2008 |
| EC | 000968607-0004 | 7/2008 |
| EC | 000968607-0005 | 7/2008 |
| EC | 000968607-0006 | 7/2008 |
| EC | 000968607-0008 | 7/2008 |
| EC | 001226088-001 | 7/2010 |
| EC | 001226088-002 | 7/2010 |
| GB | 2366084 B | 9/2002 |
| GB | 2468823 A | 9/2010 |
| GB | 2468823 B | 10/2012 |
| IN | 216979 | 6/2009 |
| IN | 216981 | 7/2009 |
| IN | 216983 | 7/2009 |
| IN | 216984 | 7/2009 |
| IN | 216982 | 8/2009 |
| IN | 216980 | 3/2010 |
| MX | 27994 | 4/2009 |
| MX | 27995 | 4/2009 |
| MX | 27996 | 4/2009 |
| MX | 29091 | 8/2009 |
| SE | 535066 C2 | 4/2012 |
| WO | 0101534 A1 | 1/2001 |
| WO | 0174091 A2 | 10/2001 |
| WO | 2005112477 A1 | 11/2005 |
| WO | 2009089008 A2 | 7/2009 |
| WO | 2009089306 A1 | 7/2009 |
| WO | 2009089307 A2 | 7/2009 |
| WO | 2009143193 A2 | 11/2009 |
| WO | 2009089307 A3 | 12/2009 |
| WO | 2009143193 A3 | 3/2010 |
| WO | 2010028384 A2 | 3/2010 |
| WO | 2010028384 A3 | 5/2010 |
| WO | 2009089203 A4 | 6/2011 |
| WO | 2011088430 A2 | 7/2011 |
| WO | 2011088438 A2 | 7/2011 |
| WO | 2011088430 A3 | 11/2011 |
| WO | 2011088438 A3 | 11/2011 |

OTHER PUBLICATIONS

Information Disclosure Statement (IDS) Letter Regarding Common Patent Application(s), dated Aug. 2, 2012.

"International Search Report" and "Written Opinion" of the International Search Authority (Korean Intellectual Property Office) in Chatsworth Products, Inc. et al., International Patent Application Serial No. PCT/US2011/021484, dated Sep. 29, 2011, 7 pages.

"International Search Report" and "Written Opinion" of the International Search Authority (Korean Intellectual Property Office) in Chatsworth Products, Inc. et al., International Patent Application Serial No. PCT/US2011/021457, dated Sep. 28, 2011, 8 pages.

Information Disclosure Statement (IDS) Letter Regarding Common Patent Application(s), dated Oct. 30, 2013.

Information Disclosure Statement (IDS) Letter Regarding Common Patent Application(s), dated Oct. 30, 2012.

Information Disclosure Statement (IDS) Letter Regarding Common Patent Application(s), dated Mar. 16, 2011.

"International Search Report" and "Written Opinion of the International Search Authority" (Australian Patent Office) in Chatsworth Products, Inc. et al., International Patent Application Serial No. PCT/US2008/030368, dated Apr. 8, 2009, 20 pages.

"International Search Report" and "Written Opinion of the International Search Authority" (Korean Intellectual Property Office) in Chatsworth Products, Inc. et al., International Patent Application Serial No. PCT/US2009/030369, dated Oct. 12, 2009, 9 pages.

"International Search Report" and "Written Opinion of the International Search Authority" (Korean Intellectual Property Office) in Chatsworth Products, Inc. et al., International Patent Application Serial No. PCT/US2009/044577, dated Jan. 12, 2010, 7 pages.

(56) References Cited

OTHER PUBLICATIONS

"International Search Report" and "Written Opinion of the International Search Authority" (European Patent Office) in Corning Cable Systems LLC, International Patent Application Serial No. PCT/US2009/000075, dated Aug. 7, 2009, 21 pages.
"International Search Report" and "Written Opinion of the International Search Authority" (Korean Intellectual Property Office) in Chatsworth Products, Inc. et al., International Patent Application Serial No. PCT/US2009/056256, dated Apr. 7, 2010, 7 pages.
Information Disclosure Statement (IDS) Letter Regarding Common Patent Application(s), dated Apr. 29, 2013.
Office Action dated Feb. 24, 2011 in Swedish Patent Application No. 1050712-7, and English translation thereof, 12 pages.
Information Disclosure Statement (IDS) Letter Regarding Common Patent Application(s), dated May 5, 2012.
Information Disclosure Statement (IDS) Letter Regarding Common Patent Application(s), dated Jan. 14, 2013.
Information Disclosure Statement (IDS) Letter Regarding Common Patent Application(s), dated Feb. 5, 2012.

* cited by examiner

HORIZONTAL CABLE MANAGER

CROSS-REFERENCE TO RELATED APPLICATION

The present application is a U.S. nonprovisional patent application of, and claims priority under 35 U.S.C. §119(e) to, U.S. provisional patent application Ser. No. 61/295,737, filed Jan. 17, 2010 and entitled "HORIZONTAL CABLE MANAGER," which is expressly incorporated by reference herein. Additionally, the following U.S. patent applications, and any publication thereof, are expressly incorporated by reference herein:
  (a) U.S. provisional patent application Ser. No. 61/295,736, filed Jan. 17, 2010 and entitled "VERTICAL CABLE MANAGER;" and
  (b) U.S. patent application Ser. No. 13/007,723, filed Jan. 17, 2011 and entitled "VERTICAL CABLE MANAGER," which published as U.S. Patent Application Publication No. U.S. 2011/0180295 A1 on Jul. 28,2001.

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

1. Field of the Present Invention

The present invention relates generally to cable management systems for telecommunications cables, and, in particular, to horizontal cable managers having adjustable internal components for better cable management.

2. Background

Racks, frames, cabinets and the like for supporting computer and other electronic equipment are very well known. Similarly, raceways for routing cables and wires to and from that equipment are likewise well known. In particular, a number of raceways have been proposed for routing cables, wires and the like (generally referred to hereinafter as "cables") vertically through or adjacent to equipment racks, frames, cabinets and the like (generally referred to hereinafter as "mounting fixtures"). Such raceways may be used to route cables vertically to equipment mounted or otherwise supported on a mounting fixture from other equipment on the mounting fixture, from an overhead or underfloor raceway, or the like. These cables are generally routed in the vertical direction to a point adjacent to the desired equipment and then routed in the horizontal direction to the desired equipment.

An important characteristic of such raceways is the presence of a plurality of openings in the sides of the raceway through which cables may be routed, thereby facilitating more convenient access between the equipment and the interior of the raceway. For example, U.S. Pat. No. 2,921,607 to Caveney, U.S. Pat. No. 3,705,949 to Weiss, commonly-assigned U.S. Pat. No. 7,119,282 to Krietzman et al., and U.S. Pat. No. 7,285,027 to McGrath et al. each disclose a covered wiring duct or wireway which includes side walls having a series of finger-like projections separated by openings. The cables may be routed through the openings by bending them around the projections, thus allowing the cables to be routed with relative precision, and preventing cables from hanging loosely across the face of the rack itself A gap at the distal ends of each pair of adjacent projections permits cables to be inserted into each respective opening. The gap is narrower than the opening, thus aiding in the retention of the cables within the opening.

The distal ends of all the projections may then be covered by a cover, thus providing further retention capability. The covers are typically hinged, oftentimes along each of two sides, so that they may be conveniently opened from either side. The hinge structure may be supported by the projections or may be supported separately. In either case, however, the hinges, if not the doors themselves, are arranged such that when opened, they can create interference with other cable managers or other equipment or accessories immediately adjacent thereto. This either creates interference for the user or necessitates that each cable manager must be spaced from other interfering cable managers, equipment or accessories.

Thus, a need exists for a hinge structure, for a horizontal cable manager, whose operation does not interfere with adjacent cable managers, equipment, or accessories.

SUMMARY OF THE PRESENT INVENTION

The present invention includes many aspects and features. Moreover, while many aspects and features relate to, and are described in, the context of cable management systems for telecommunications cables, the present invention is not limited to use only in cable management systems for telecommunications cables, as will become apparent from the following summaries and detailed descriptions of aspects, features, and one or more embodiments of the present invention.

Broadly defined, the present invention according to one aspect includes a cable manager having a trough, defining a footprint, and a door, rotatably attached along at least one of its longitudinal edges to the trough. The door may be rotated to a fully open state without extending beyond the footprint of the trough.

Broadly defined, the present invention according to another aspect includes a cable manager having a trough and a door. At least one side of the trough is formed from a plurality of finger-like projections extending forwardly from a support member. At least two of the projections include a hinge boss disposed at the outer end thereof and extending inwardly. At least one edge of the door has a hinge structure disposed therealong. The hinge structure includes an outer arm and an inner arm defining a hinge channel therebetween. The outer hinge arm includes a semi-cylindrical inner surface, and the inner hinge arm includes a semi-cylindrical pivot.

In features of this aspect, the cable manager further includes an indexing stop on one of the hinge boss and the hinge structure to retain the door in an open state.

Broadly defined, the present invention according to still another aspect includes a cable manager having a trough and a door. At least one side of the trough is formed from a plurality of finger-like projections extending forwardly from a support member. At least two of the projections include a hinge boss disposed at the outer end thereof and extending inwardly. Each hinge boss includes an outer semi-cylindrical barrel and an inner semi-cylindrical surface. At least one edge of the door has a hinge structure disposed therealong. The hinge structure includes an outer arm and an inner arm defining a hinge channel therebetween. The outer hinge channel is adapted to receive and rotate about the hinge boss.

In features of this aspect, the cable manager further includes an indexing stop on one of the hinge boss and the hinge structure to retain the door in an open state.

Broadly defined, the present invention according to still another aspect includes a mounting fixture system having a rack and a cable manager, substantially as shown and described.

Broadly defined, the present invention according to still another aspect includes a cable manager, substantially as shown and described.

Broadly defined, the present invention according to still another aspect includes a side cable guide for a cable manager, substantially as shown and described.

Broadly defined, the present invention according to still another aspect includes a finger-like projection for a cable guide in a cable manager, substantially as shown and described.

Broadly defined, the present invention according to still another aspect includes a cable manager having a trough, defining a footprint, and a door. At least one side of the trough is formed from a plurality of finger-like projections extending forwardly from a support member. At least two of the projections include a hinge boss disposed at an outer end thereof and extending inwardly. At least one edge of the door has a hinge structure disposed therealong. The hinge structure includes an outer arm and an inner arm defining a hinge channel therebetween. The hinge bosses are disposed within the hinge channel such that the door is rotatably attached along at least one of its longitudinal edges to the trough. The door is rotatable to an open state without extending beyond the footprint of the trough.

In features of this aspect, the finger-like projections may have a U-shaped cross section; at least one of the finger-like projections may include at least one crescent-shaped reinforcement wall; the finger-like projections may include T-shaped projections; adjacent finger-like projections, in conjunction with at least a portion of the support member, may define a cable ring; the cable ring may include a gap to permit cables to be inserted into the cable ring; adjacent finger-like projections may be spaced apart by approximately 1 RMU; the finger-like projections may be integral with the support member; the hinge bosses may be integral with their corresponding finger-like projections; and the cable manager may further include an indexing stop on one of the hinge boss and the hinge structure for retaining the door in an open state.

In another feature of this aspect, the inner arm of the hinge structure may include a semi-cylindrical pivot, and each hinge boss may include an inner semi-cylindrical surface; and the semi-cylindrical pivot may be generally concentrically received against the inner semi-cylindrical surface of the hinge bosses. In another feature of this aspect, the outer arm of the hinge structure may include an inner semi-cylindrical surface, and each hinge boss may further include an outer semi-cylindrical barrel; and the outer semi-cylindrical barrel of the hinge bosses may be generally concentrically received against the inner semi-cylindrical surface of the outer arm. In another feature of this aspect, the door may be retainable in an open state when an indexing stop on the hinge structure reaches and snaps into an indexing groove on the hinge bosses.

In still other features of this aspect, both sides of the trough may be formed from a plurality of finger-like projections extending forwardly from a support member; and the sides may define a trough height between approximately 1 RMU and approximately 3 RMU.

Broadly defined, the present invention according to still another aspect includes a cable manager having a trough and a door. At least one side of the trough is formed from a plurality of finger-like projections extending forwardly from a support member. At least two of the projections include a hinge boss disposed at an outer end thereof and extending inwardly. At least one edge of the door has a hinge structure disposed therealong for receiving and rotating about the hinge bosses. The hinge structure includes an outer arm and an inner arm defining a hinge channel therebetween. The outer arm includes an inner semi-cylindrical surface, and the inner arm includes a semi-cylindrical pivot.

In features of this aspect, the finger-like projections may have a U-shaped cross section; at least one of the finger-like projections may include at least one crescent-shaped reinforcement wall; the finger-like projections may be integral with the support member; the hinge bosses may be integral with their corresponding finger-like projections; and the cable manager may further include an indexing stop on one of the hinge boss and the hinge structure for retaining the door in an open state.

In another feature of this aspect, each hinge boss may include an inner semi-cylindrical surface and an outer semi-cylindrical barrel. In another feature of this aspect, the semi-cylindrical pivot may be adapted to be generally concentrically received against the inner semi-cylindrical surface of the hinge bosses; and the outer semi-cylindrical barrel of the hinge bosses may be adapted to be generally concentrically received against the inner semi-cylindrical surface of the outer arm. In still another feature of this aspect the door may be retainable in an open state when an indexing stop on the hinge structure reaches and snaps into an indexing groove on the hinge bosses.

Broadly defined, the present invention according to still another aspect includes a cable manager having a trough and a door. At least one side of the trough is formed from a plurality of finger-like projections extending forwardly from a support member. At least two of the projections include a hinge boss disposed at an outer end thereof and extending inwardly. Each hinge boss includes an outer semi-cylindrical barrel and an inner semi-cylindrical surface. At least one edge of the door has a hinge structure disposed therealong. The hinge structure includes an outer arm and an inner arm defining a hinge channel therebetween. The hinge channel is adapted to receive and rotate about the hinge bosses.

In features of this aspect, the finger-like projections may have a U-shaped cross section; at least one of the finger-like projections may include at least one crescent-shaped reinforcement wall; the finger-like projections may be integral with the support member; the hinge bosses may be integral with their corresponding finger-like projections; and the cable manager may further include an indexing stop on one of the hinge boss and the hinge structure for retaining the door in an open state.

In another feature of this aspect, the outer arm may include an inner semi-cylindrical surface, and the inner arm may include a semi-cylindrical pivot. In another feature of this aspect, the semi-cylindrical pivot may be adapted to be generally concentrically received against the inner semi-cylindrical surface of the hinge bosses; and the outer semi-cylindrical barrel of the hinge bosses may be adapted to be generally concentrically received against the inner semi-cylindrical surface of the outer arm. In still another feature of this aspect, the door may be retainable in an open state when an indexing stop on the hinge structure reaches and snaps into an indexing groove on the hinge bosses.

Broadly defined, the present invention according to still another aspect includes a cable manager having a trough, defining a footprint, and a door. The door is rotatably attached along at least one of its longitudinal edges to the trough. The door is rotatable to a fully open state without extending beyond the footprint of the trough.

In features of this aspect, at least one side of the trough may be formed from a plurality of finger-like projections extending forwardly from a support member; the finger-like projections may have a U-shaped cross section; at least one of the finger-like projections may include at least one crescent-shaped reinforcement wall; at least one edge of the door may have a hinge structure disposed therealong for rotatable attachment to the trough; and the cable manager may further include an indexing stop on the hinge structure for retaining the door in an open state.

Broadly defined, the present invention according to still another aspect includes a mounting fixture system having an electronic equipment rack and a cable manager mounted on the rack. The cable manager includes a trough, defining a footprint, and a door rotatably attached along at least one of its longitudinal edges to the trough. The door is rotatable to a fully open state without extending beyond the footprint of the trough.

In features of this aspect, at least one side of the trough may be formed from a plurality of finger-like projections extending forwardly from a support member; the finger-like projections may have a U-shaped cross section; at least one of the finger-like projections may include at least one crescent-shaped reinforcement wall; at least one edge of the door may have a hinge structure disposed therealong for rotatable attachment to the trough; and the mounting fixture system may further include an indexing stop on the hinge structure for retaining the door in an open state.

Broadly defined, the present invention according to still another aspect includes a side cable guide for a cable manager having a support member and a plurality of finger-like projections extending forwardly from the support member. At least two of the projections include a hinge boss disposed at an outer end thereof and extending inwardly. The hinge bosses each include an inner semi-cylindrical surface, an outer semi-cylindrical barrel and an indexing groove.

In features of this aspect, the hinge bosses may be adapted to be disposed in the hinge channel of a door such that the door may be rotatably attached thereto; and the indexing groove may be configured for receipt of an indexing stop on the door such that the door is retainable in an open state.

In other features of this aspect, the finger-like projections may have a U-shaped cross section; at least one of the finger-like projections may include at least one crescent-shaped reinforcement wall; the finger-like projections may include T-shaped projections; adjacent finger-like projections, in conjunction with at least a portion of the support member, may define a cable ring; the cable ring may include a gap to permit cables to be inserted into the cable ring; adjacent finger-like projections may be spaced apart by approximately 1 RMU; the finger-like projections may be integral with the support member; and the hinge bosses may be integral with their corresponding finger-like projections.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION

Figure 1:
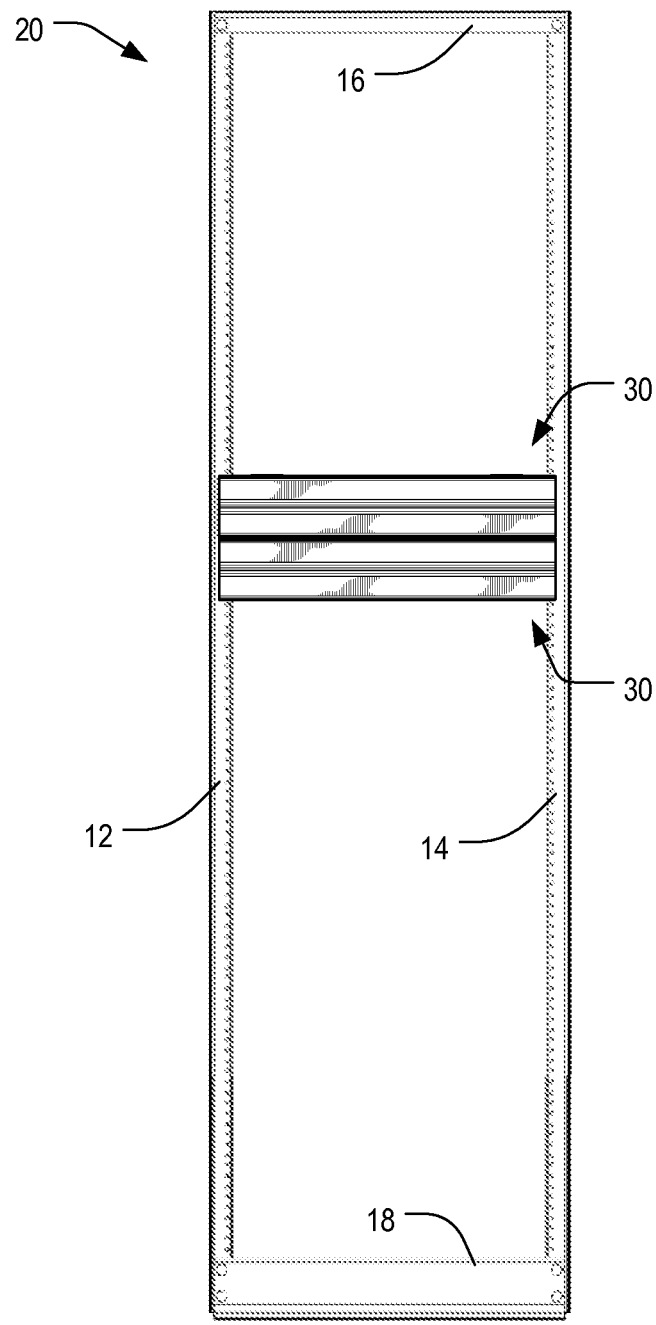
FIG. 1 is a front plan view of a mounting fixture system utilizing a horizontal cable manager in accordance with one or more preferred embodiments of the present invention.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of one or more preferred embodiment(s) is merely exemplary in nature and is in no way intended to limit the invention, its application, or uses.

FIG. 1 is a front plan view of a mounting fixture system 10 utilizing a horizontal cable manager 30 in accordance with one or more preferred embodiments of the present invention. As shown, the system 10 includes a conventional two-post mounting rack 20 on which are mounted two horizontal cable managers 30. The two-post mounting rack 20 includes a pair of vertical support members 12,14, connected at their upper ends by a pair of upper cross-members 16 and at their lower ends by a pair of lower cross-members 18. The posts 12,14 are arranged to support a variety of electronic equipment, accessories and the like, all as is well known.

It will be apparent to the Ordinary Artisan that the arrangement illustrated in FIG. 1 may be a preferred implementation of one or more of the horizontal cable managers described and illustrated herein. However, it will be appreciated that the horizontal cable manager of the present invention may be utilized with a variety of mounting fixtures, for example including mounting fixtures formed from four support posts that may or may not be covered by panels to form an enclosure; and that additional mounting fixtures may be alternatively located on one or both sides of the mounting fixture on which the cable manager 30 is mounted.

Figure 2:
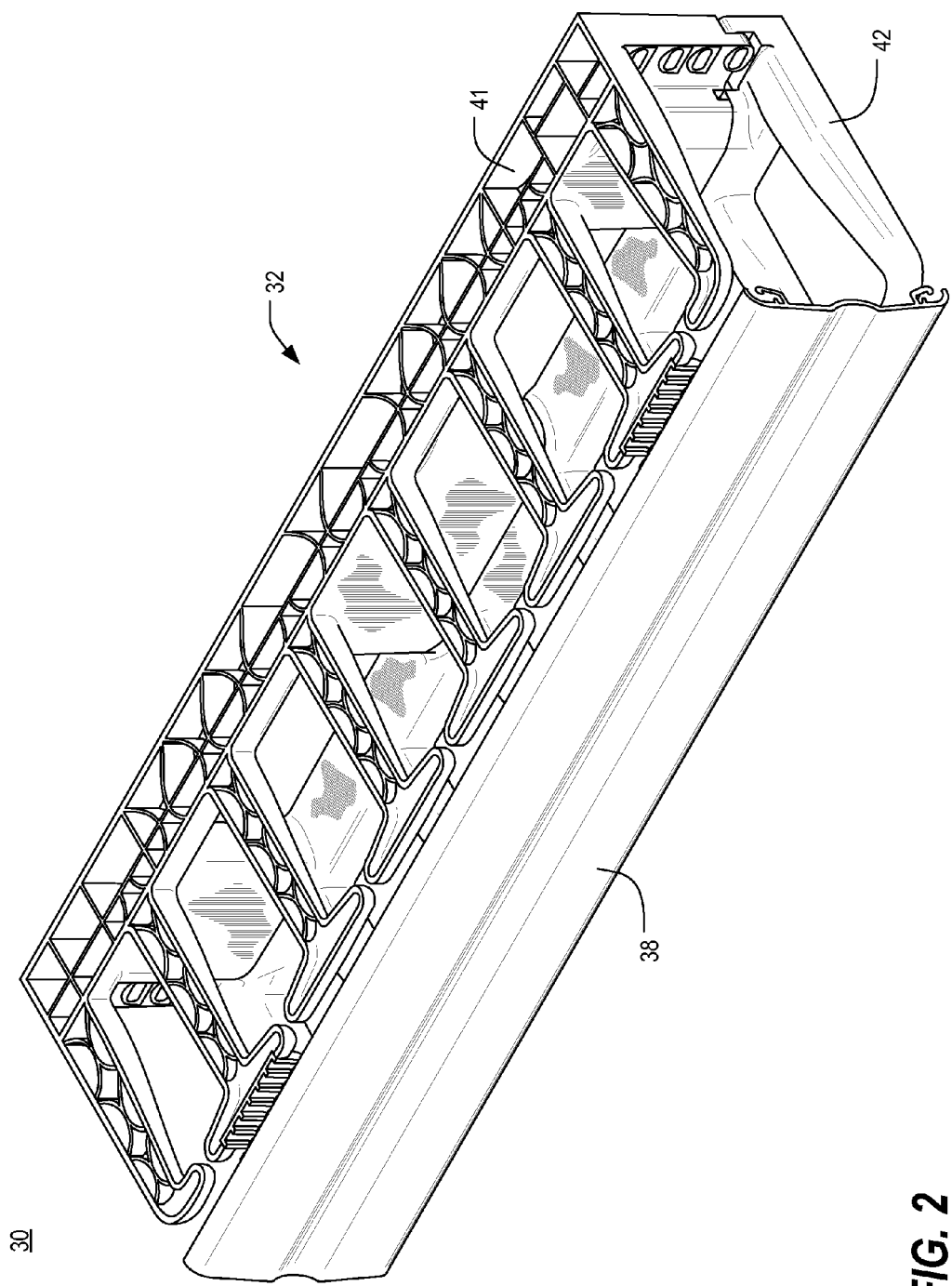
FIG. 2 is a front isometric view of one of the horizontal cable managers of FIG. 1, shown in isolation.

FIG. 2 is a front isometric view of one of the horizontal cable managers 30 of FIG. 1, shown in isolation. As shown therein, the horizontal cable manager 30 includes a trough 32, formed by a pair of side cable guides 41,42, and a door 38. Each of these components will be described in greater detail herein.

Figure 3:
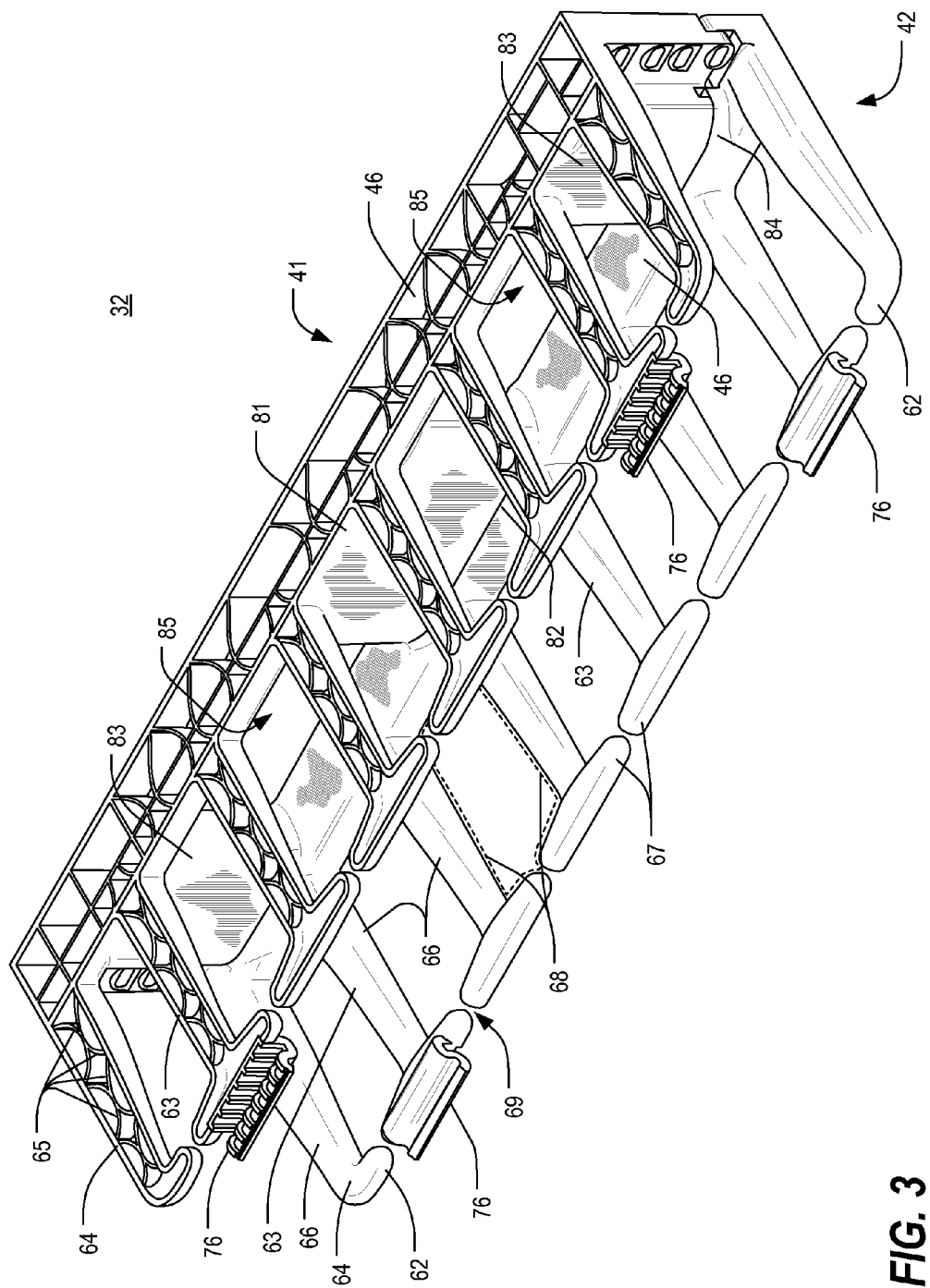
FIG. 3 is an isometric view of the trough of FIG. 2.

FIG. 3 is an isometric view of the trough 32 of FIG. 2. Each side cable guide 41,42 has a plurality of T- and L-shaped rib or finger projections 63,64 extending forwardly from a horizontal support member 46. A central post 81,82 and two end posts 83,84 extend orthogonally from the horizontal support member 46 toward the other cable guide 42,41. Passthrough openings 85 are defined between the posts for the purpose of routing cables and other wires from the interior of the trough 32 through to the rear.

Figure 4:
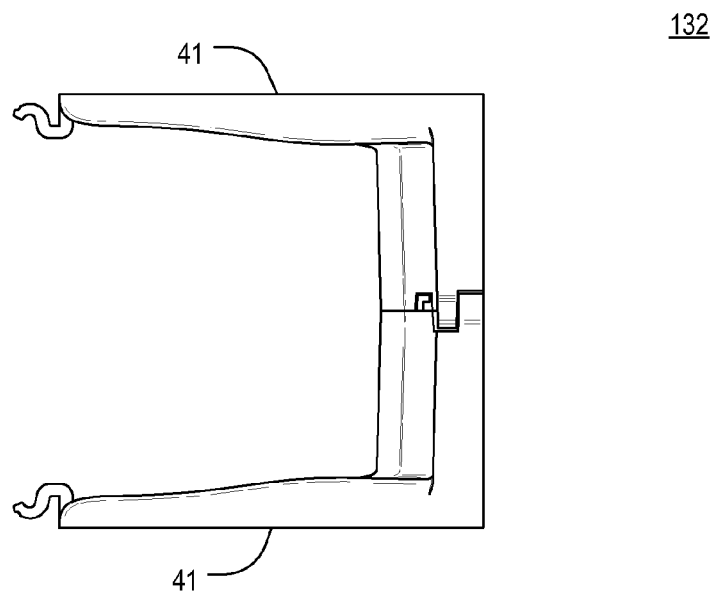
FIGS. 4 and 5 are end views of a trough comprised of two of the larger side cable guides and a trough comprised of two of the smaller side cable guides, respectively.
Figure 5:
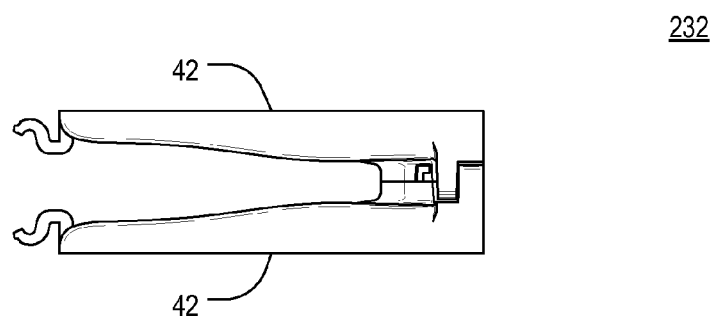

The two side cable guides 41,42 are generally similar to each other except for the lengths of the central posts 81,82 and end posts 83,84. In the embodiment illustrated in FIG. 3, the upper side cable guide 41 is larger than the lower side cable guide 42. It will be appreciated, however, that two of the larger side cable guides 41 may be combined together to make a larger trough 132, and that two of the smaller side cable guides 42 may be combined together to make a smaller trough 232. FIGS. 4 and 5 are end views of a trough 132 comprised of two of the larger side cable guides 41 and a trough 232 comprised of two of the smaller side cable guides 42, respectively.

Referring again to FIG. 3, each T-shaped projection 63 includes a shaft 66 and a full crosspiece 67, while each L-shaped projection 64 includes a shaft 66 and a half crosspiece 62. Each pair of adjacent T-shaped and L-shaped projections 63,64 defines a cable ring 68 formed by the respective shafts 66 and crosspieces 67 of the projections 63 and the body of the support column 46. An opening into each cable ring 68 is provided by a gap 69 between the ends of the crosspieces 67 of each pair of adjacent projections 63. This gap 69 permits cables to be inserted into the ring 68 by passing them sideways through the gap 69, as described further in commonly-assigned U.S. Pat. No. 7,119,282 to Krietzman et al., the entirety of which is expressly incorporated herein by reference.

As illustrated in the top row of projections 63,64 in FIG. 3, the shaft 66 of each projection 63,64 utilizes a reinforced construction characterized by a series of interlocking crescent-shaped reinforcement walls or ribs 65. This geometry is designed to minimize deflection under load in the vertical, horizontal, and twist directions. The finger cross section is U-shaped which gives the greatest strength in the vertical and horizontal direction. The interior ribs 65 are designed to minimize the twist and to also add strength in the vertical and horizontal direction.

The respective projections 63,64 are evenly spaced along the length of the horizontal support member 46 at a standardized spacing. In the embodiment shown and described, the spacing between the respective projections 63,64 is equal to a single standard rack mounting unit ("RMU") (conventionally, 1.75 inches), but it should be obvious that other standard spacings could be used such as spacings measured in alternative units or spacings which are multiples of the RMU. By using such a standard spacing, it is ensured that a cable ring 68 is disposed at, and dedicated to, each RMU along the width of a rack 20. Benefits of this arrangement are further described in U.S. Pat. No. 7,119,282.

Furthermore, the sizes of the side cable guides 41,42 are preferably also selected to correspond to standardized units. In particular, the combination of one large side cable guide 41 and one small cable guide 42 that is illustrated in FIG. 3 is preferably designed to occupy 2 RMUs along the height of a rack 20, while the combination of two large side cable guides 41 that is illustrated in FIG. 4 is preferably designed to occupy 3 RMUs along the height of a rack 20, and the combination of two small side cable guides 42 that is illustrated in FIG. 5 is preferably designed to occupy 1 RMU along the height of a rack 20.

In at least one embodiment, the T-shaped projections 63,64 are integrally formed with the horizontal support member 46 and posts using an injection molding process. In at least some aspects of the present invention, however, the side cable guides 42 may be constructed according to the teachings of commonly-assigned U.S. patent application Ser. No. 12/350,216 to Garza et al., which published as U.S. Patent Application Publication No. US 2009/0236117 A1, the entirety of which is expressly incorporated by reference herein.

Figure 6:
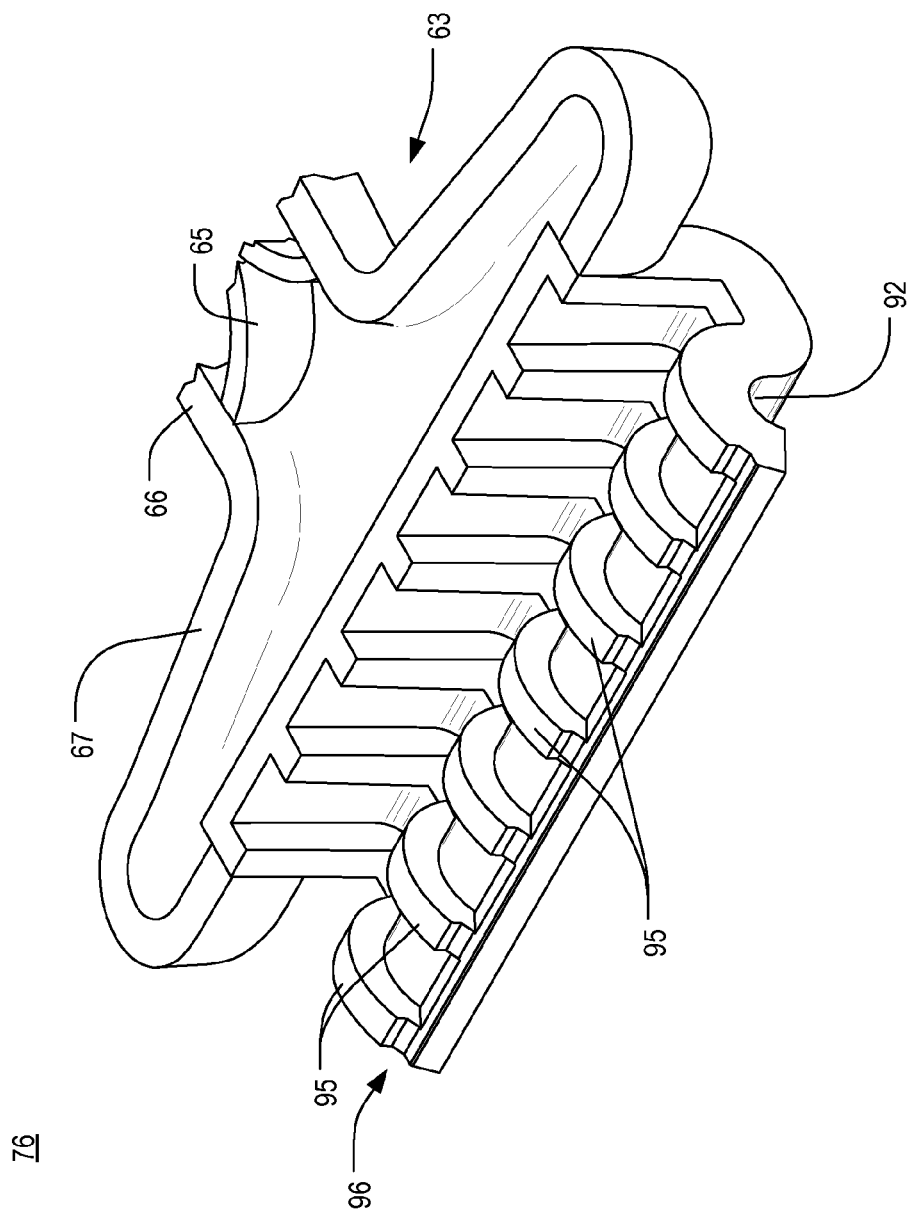
FIGS. 6 and 7 are a fragmentary isometric view and a fragmentary side view, respectively, of one of the hinge bosses.
Figure 7:
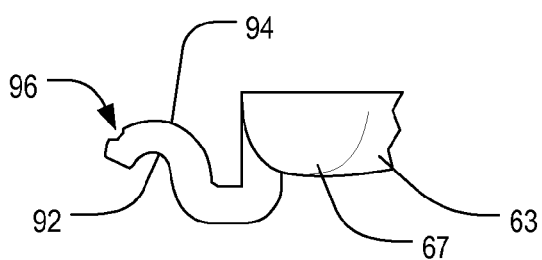

Referring again to FIG. 3, it will be appreciated that some of the T-shaped projections 63 include door attachment hinge bosses 76 disposed at the ends thereof. FIGS. 6 and 7 are a fragmentary isometric view and a fragmentary side view, respectively, of one of the hinge bosses 76. Each hinge boss 76 includes an inner semi-cylindrical surface 92 and an outer semi-cylindrical barrel 94 formed by a series of ridges 95. An indexing groove 96 is arranged near the ends of the ridges 95. The hinge boss may be molded with the rest of the projections 63 and side cable guides 41,42.

Figure 8:
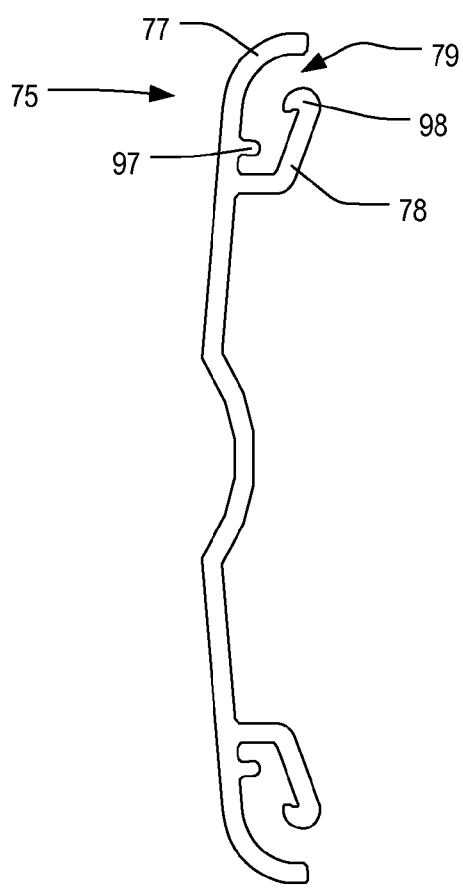
FIG. 8 is an end view of the door of FIG. 2.

FIG. 8 is an end view of the door 38 of FIG. 2. As shown therein, the door 38 includes hinge structures 75 along both longitudinal edges. The hinge structure 75 includes two arms 77,78, defining a hinge channel 79, that may be snapped around the hinge bosses 76. The outer arm 77 includes an indexing stop 97, while the inner arm 78 includes a semi-cylindrical pivot 98 adapted to be received in the inner semi-cylindrical surface 92 of the hinge boss 76.

Figure 9:
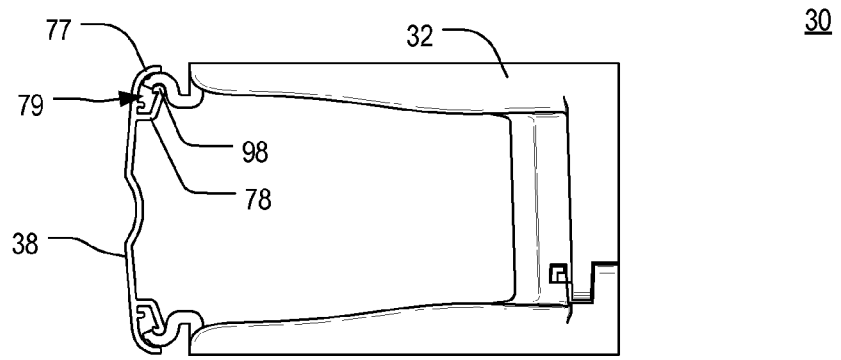
FIG. 9 is an end view of the horizontal cable manager of FIG. 2, showing the door installed on both the upper and lower hinge bosses of the trough.
Figure 10:
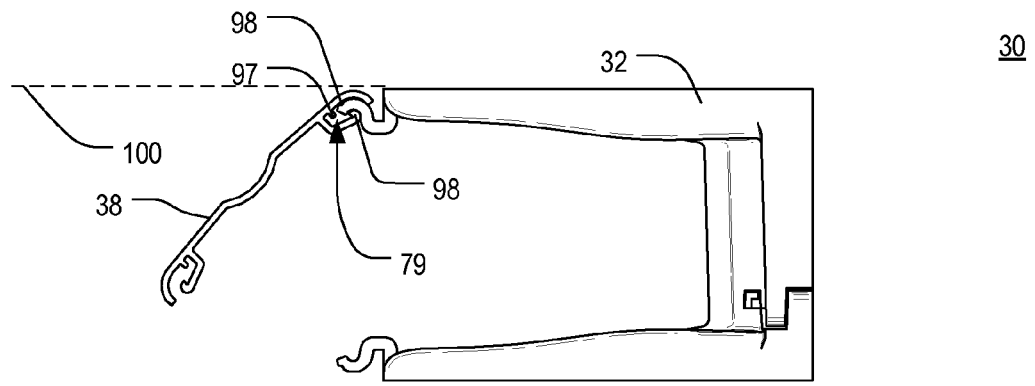
FIGS. 10 and 11 are end views of the horizontal cable manager of FIG. 9, showing the door being opened along its lower edge and rotated upward about the upper hinge bosses of the trough.
Figure 11:
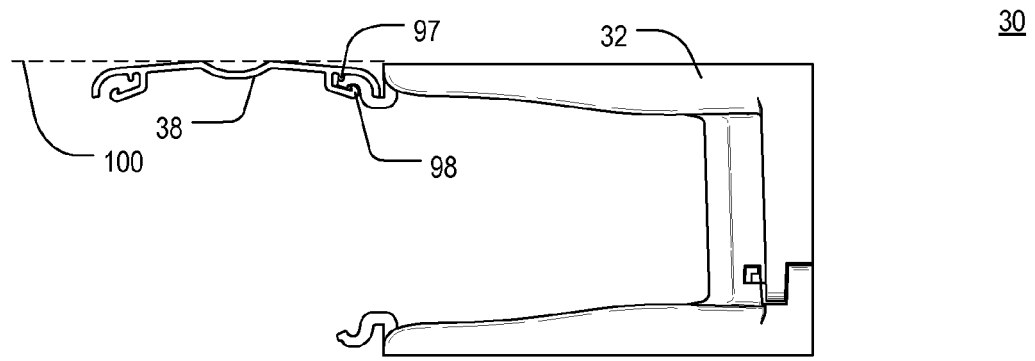
Figure 12:
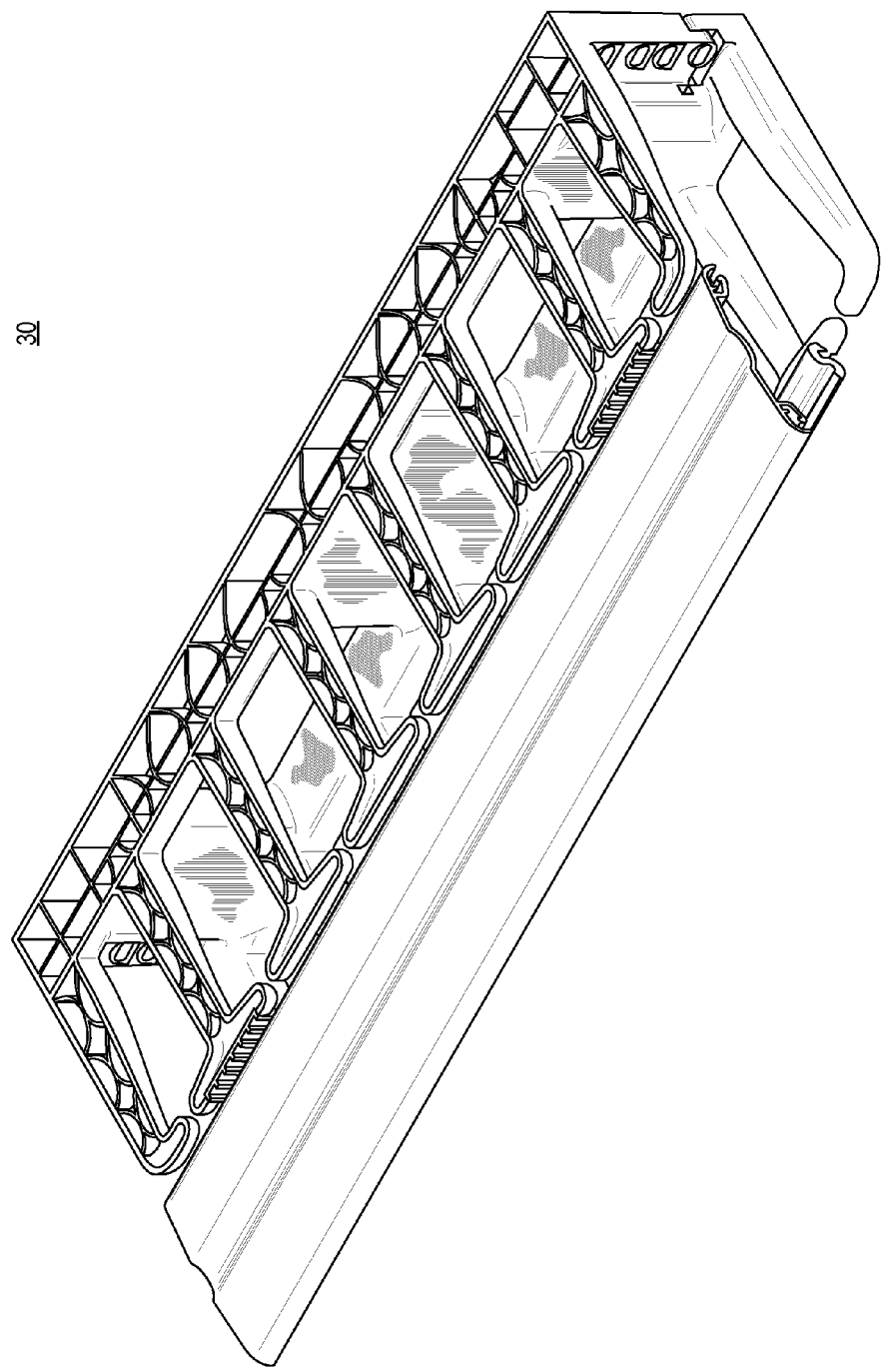
FIG. 12 is an isometric view of the horizontal cable manager of FIG. 11, showing the door in a fully open and stationary position.

The door 38 is mounted on the side cable guides 41,42 by snapping the hinge structure 75 onto the hinge bosses 76. FIG. 9 is an end view of the horizontal cable manager 30 of FIG. 2, showing the door 38 installed on both the upper and lower hinge bosses 76 of the trough 32. The door 38 may then be opened along either its upper or lower edge or removed altogether. FIGS. 10 and 11 are end views of the horizontal cable manager 30 of FIG. 9, showing the door 38 being opened along its lower edge and rotated upward about the upper hinge bosses 76 of the trough 32. As illustrated therein, the hinge boss 76 is disposed in the hinge channel 79 defined between the hinge structure arms 77,78. The semi-cylindrical pivot 98 rotates along the semi-cylindrical surface 92 of the hinge boss 76, and the outer arm 77, which is also semi-cylindrical, rotates along the semi-cylindrical barrel 94 of the hinge boss 76. As the door 38 is rotated to the position shown in FIG. 5, it will be appreciated that the indexing stop 97 reaches the groove 96 on the hinge boss 76. When it does so, it snaps into place in the groove 96, thereby holding the door 38 in place in that position. The force required to rotate the door 38 out of that position is intended to be relatively minimal such that a user may manipulate the door 38 easily to remain open or to be closed, as desired. FIG. 12 is an isometric view of the horizontal cable manager 30 of FIG. 11, showing the door 38 in a fully open and stationary position.

Figure 13:
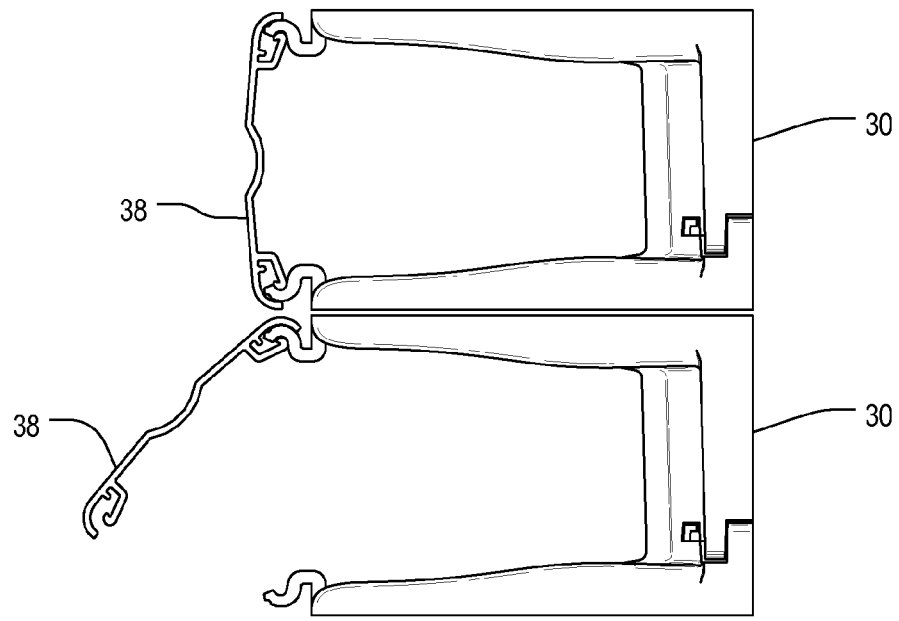
FIGS. 13 and 14 are end views of the two horizontal cable managers of FIG. 1 with their doors in various states.
Figure 14:
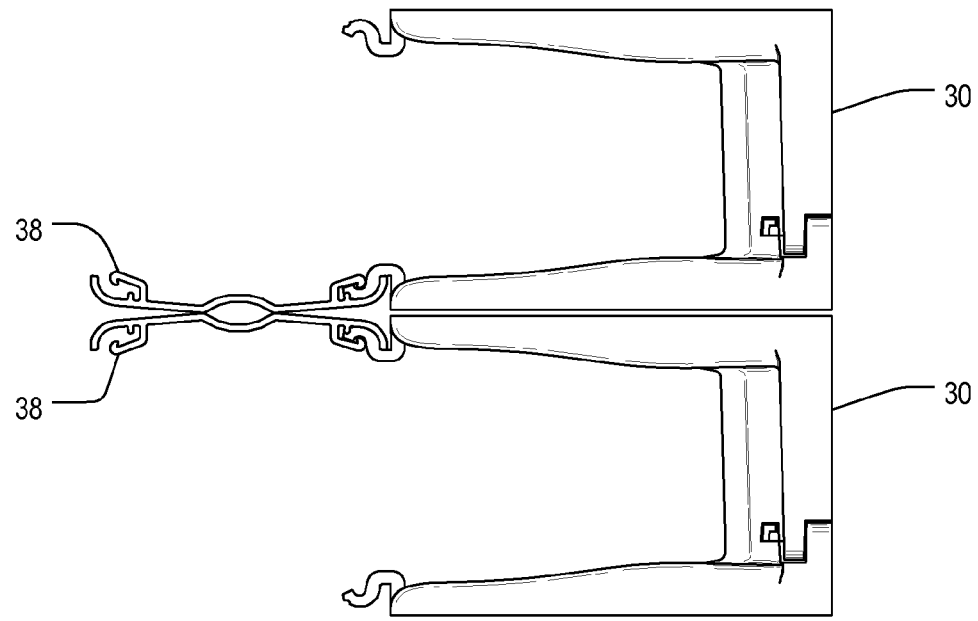

With reference to FIGS. 10 and 11, it will be appreciated that the concentric nature of the various elements of the hinge boss 76 and hinge structure 95 results in rotation of the door 38 within a limited space. In particular, during its rotation the door 38 moves entirely within the footprint of the cable manager 30, illustrated by line 100. This is particularly advantageous in installations in which equipment and accessories are mounted close together on a rack 20 or the like in that operation of the door 38 of one cable manager 30 does not interfere with other equipment or accessories. This is more fully illustrated in FIGS. 13 and 14, which are end views of the two horizontal cable managers 30 of FIG. 1 with their doors in various states. In FIG. 13, the upper door 38 is closed, and the lower door is being opened without interfering with, or being interfered by, the upper door 38. In FIG. 13, both doors 38 are open and in their stationary position without interfering with each other. Other configurations are likewise possible.

The cable managers described above are "single-sided" cable managers in that they include T-shaped and L-shaped projections 63,64 extending only in one direction, and thus comprise only one horizontal cable trough for routing cables on either the front or back of the rack 20. However, the same principles may likewise be applied to create a "double-sided" horizontal cable manager (not shown) that is similar to the single-sided version but with projections 63,64 extending both forwardly and rearwardly from horizontal support members and include doors on each side.

Furthermore, as described herein, the invention is disclosed in a horizontal orientation. However, it will be appreciated that all or part of the invention as described herein may be implemented in a vertical orientation. For example, it is contemplated that the cable manager as described herein may be implemented for use in a vertical orientation.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof.

What is claimed is:

1. A cable manager, comprising:
    (a) a trough, defining a footprint, wherein at least one side of the trough is formed from a plurality of finger-like projections extending forwardly from a support member, at least two of the projections including a hinge boss disposed at an outer end thereof and extending inwardly; and
    (b) a door, at least one edge of which has a hinge structure disposed therealong, the hinge structure including an outer arm and an inner arm defining a hinge channel therebetween;
    (c) wherein the hinge bosses are disposed within the hinge channel such that the door is rotatably attached along at least one of its longitudinal edges to the trough; and
    (d) wherein the door is rotatable to an open state without extending beyond the footprint of the trough.

2. The cable manager of claim 1, wherein the finger-like projections have a U-shaped cross section.

3. The cable manager of claim 2, wherein at least one of the finger-like projections includes at least one crescent-shaped reinforcement wall.

4. The cable manager of claim 1, wherein the finger-like projections include T-shaped projections.

5. The cable manager of claim 4, wherein adjacent finger-like projections, in conjunction with at least a portion of the support member, define a cable ring.

6. The cable manager of claim 5, wherein the cable ring includes a gap to permit cables to be inserted into the cable ring.

7. The cable manager of claim 4, wherein adjacent finger-like projections are spaced apart by approximately 1 RMU.

8. The cable manager of claim 1, wherein the finger-like projections are integral with the support member.

9. The cable manager of claim 8, wherein the hinge bosses are integral with their corresponding finger-like projections.

10. The cable manager of claim 1, further comprising an indexing stop on one of the hinge boss and the hinge structure for retaining the door in an open state.

11. The cable manager of claim 1,
   (a) wherein the inner arm of the hinge structure includes a semi-cylindrical pivot, and each hinge boss includes an inner semi-cylindrical surface; and
   (b) wherein the semi-cylindrical pivot is generally concentrically received against the inner semi-cylindrical surface of the hinge bosses.

12. The cable manager of claim 11,
   (a) wherein the outer arm of the hinge structure includes an inner semi-cylindrical surface, and each hinge boss further includes an outer semi-cylindrical barrel; and
   (b) wherein the outer semi-cylindrical barrel of the hinge bosses is generally concentrically received against the inner semi-cylindrical surface of the outer arm.

13. The cable manager of claim 12, wherein the door is retainable in an open state when an indexing stop on the hinge structure reaches and snaps into an indexing groove on the hinge bosses.

14. The cable manager of claim 1, wherein another side of the trough is formed from a plurality of finger-like projections extending forwardly from a support member.

15. The cable manager of claim 14, wherein the sides, together, define a trough height between approximately 1 RMU and approximately 3 RMU.

16. The cable manager of claim 14, wherein each of the sides defines a trough height between approximately 0.5 RMU and approximately 2 RMU.

17. The cable manager of claim 16, wherein the trough height of each of the sides is the same.

18. The cable manager of claim 16, wherein the trough height of one of the sides is different than the trough height of another of the sides.

19. The cable manager of claim 1, wherein the trough is formed of a first side and a second side, each of the sides defining a trough height between approximately 0.5 RMU and approximately 2 RMU.

20. The cable manager of claim 19, wherein the trough height of the first side is the same as the trough height of the second side.

21. The cable manager of claim 19, wherein the trough height of the first side is different than the trough height of the second side.

* * * * *